US009202749B2

(12) United States Patent
Ponoth et al.

(10) Patent No.: US 9,202,749 B2
(45) Date of Patent: Dec. 1, 2015

(54) PROCESS METHODS FOR ADVANCED INTERCONNECT PATTERNING

(71) Applicant: International Business Machines Corporation, Armonk, NY (US)

(72) Inventors: Shom Ponoth, Gaithersburg, MD (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/174,089

(22) Filed: Feb. 6, 2014

(65) Prior Publication Data
US 2015/0221549 A1 Aug. 6, 2015

(51) Int. Cl.
H01L 23/495 (2006.01)
H01L 21/768 (2006.01)
H01L 21/033 (2006.01)
H01L 21/311 (2006.01)

(52) U.S. Cl.
CPC ...... H01L 21/76843 (2013.01); H01L 21/0334 (2013.01); H01L 21/31111 (2013.01); H01L 21/7684 (2013.01); H01L 21/76802 (2013.01); H01L 21/76877 (2013.01); H01L 21/76897 (2013.01)

(58) Field of Classification Search
CPC ............ H01L 21/76802; H01L 21/7684; H01L 21/76877; H01L 21/76897; H01L 21/76801
USPC ................. 438/533, 671, 672, 675
See application file for complete search history.

(56) References Cited

U.S. PATENT DOCUMENTS

| 5,585,673 | A | 12/1996 | Joshi et al. |
| 5,695,810 | A | 12/1997 | Dubin et al. |
| 6,265,313 | B1* | 7/2001 | Huang et al. ............ 438/687 |
| 6,323,554 | B1 | 11/2001 | Joshi et al. |
| 6,342,733 | B1 | 1/2002 | Hu et al. |
| 6,383,952 | B1 | 5/2002 | Subramanian et al. |
| 6,706,625 | B1 | 3/2004 | Sudijono et al. |
| 7,790,611 | B2 | 9/2010 | Anderson et al. |
| 8,105,949 | B2 | 1/2012 | Honda et al. |

(Continued)

OTHER PUBLICATIONS

Versluijs, J., et al., "30-nm half-pitch metal patterning using Motif™ critical dimension shrink technique and double patterning", Journal of Micro/Nanolithography, MEMS, and MOEMS, Jan.-Mar. 2009, pp. 011007-1 to 6, vol. 8(1).

(Continued)

Primary Examiner — Quoc Hoang
(74) Attorney, Agent, or Firm — Scully, Scott, Murphy & Presser, P.C.; Steven J. Meyers, Esq.

(57) ABSTRACT

Methods for achieving advanced patterning of an interconnect dielectric material layer are provided in which the dimension, i.e., width, of an opening that is formed into a metallic hard mask layer is shrunk prior to extending the opening into the interconnect dielectric material layer. The shrinking of the dimension of the opening that is formed into the metallic hard mask layer can be achieved in the present application by forming at least a metallic hard mask spacer portion on a sidewall surface of each patterned metallic hard mask layer. The aforementioned basic principle can be applied to forming a line opening, a via opening and/or a combined via and line opening within an interconnect dielectric material layer, wherein each of the openings (line, via and/or via and line) has a reduced dimension as compared to that obtainable utilizing conventional lithography.

17 Claims, 9 Drawing Sheets

(56) References Cited

U.S. PATENT DOCUMENTS

| | | | |
|---|---|---|---|
| 8,114,769 B1 | 2/2012 | Srivastava et al. | |
| 8,299,625 B2 | 10/2012 | Ponoth et al. | |
| 8,883,648 B1 * | 11/2014 | Hsieh et al. | 438/703 |
| 2004/0113279 A1 | 6/2004 | Chen et al. | |
| 2009/0191711 A1 | 7/2009 | Rui et al. | |
| 2010/0018944 A1 * | 1/2010 | Lai et al. | 216/13 |
| 2013/0109185 A1 * | 5/2013 | Wang et al. | 438/700 |

OTHER PUBLICATIONS

De Beeck, M.O., et al., "Manufacturability issues with double patterning for 50-nm half-pitch single damascene applications using RELACS shrink and corresponding OPC", Presented at Conference, Optical Microlithography XX, San Jose, CA on Feb. 25, 2007; also SPIE Proceedings, printed for publication: Mar. 9, 2007, vol. 6520 (3), pp. 652001.1-652001.13.

Wallace, C., et al., "Optimization of resist shrink techniques for contact hole and metal trench ArF lithography at the 90-nm technology node", Presented at Conference, Advances in Resist Technology and Processing XXI, Santa Clara, CA on Feb. 22, 2004; also Proc. SPIE 5376, Advances in Resist Technology and Processing XXI, 238 printed for publication May 14, 2004, pp. 238-244.

De Beeck, M.O., et al., "A novel plasma-assisted shrink process to enlarge process windows of narrow trenches and contacts for 45-nm node applications and beyond", Presented at Conference, Advances in Resist Materials and Processing Technology XXIV, San Jose, CA on Feb. 25, 2007; also Proc. SPIE 6519, Advances in Resist Materials and Processing Technology XXIV, printed for publication on Mar. 21, 2007, pp. 65190U-1 to 9.

Toyoshima et al., "0.1 µm level contact hole pattern formation with KrF lithography by resolution enhancement lithography assisted by chemical shrink (RELACS)", Advanced Technology R&D Center, Mitsubishi Electric Corp., IEDM IEEE, Dec. 6-9, 1998, pp. 98-333-336.

Besling, W.F.A., et al., "Line resistance behaviour in narrow lines patterned by a TiN hard mask spacer for 45 nm node interconnects", Microelectronic Engineering, Available online: Aug. 12, 2004, printed for publication: Oct. 2004, pp. 167-174, vol. 76, Issues 1-4.

Steinlesberger, G., et al., "Electrical assessment of copper damascene interconnects down to sub-50 nm feature sizes", Microelectronic Engineering, Oct. 2002, pp. 409-416, vol. 64, Issues 1-4.

Milenin, A.P., et al., "C2H4 based plasma assisted CD shrink and contact patterning for RRAM application", Materials Research Society, Symposium Proceedings held on Apr. 5-9, 2010, San Francisco, CA, vol. 1249, pp. 211-216.

* cited by examiner

PROCESS METHODS FOR ADVANCED INTERCONNECT PATTERNING

BACKGROUND

The present application relates to semiconductor device manufacturing, and more particularly to methods of forming patterns within an interconnect structure that have a reduced critical dimension.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene interconnect structures. The interconnect structure typically includes copper, Cu, or a Cu alloy since Cu-based interconnects provide higher speed signal transmission between large numbers of transistors on a complex semiconductor chip as compared with aluminum, Al-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") is achieved in today's IC product chips by embedding the metal lines and metal vias (e.g., conductive features) in a dielectric material having a dielectric constant of less than 4.0.

During the formation of interconnect structures, the interconnect conductive metal, e.g., copper, is typically formed within an opening, e.g., line and/or via, which is present in an interconnect dielectric material. The opening that is provided within the interconnect dielectric material is typically formed utilizing lithography and etching. The resolution of the pattern that is provided by current lithography techniques is limited to 30 nm; below 30 nm the resolution of current lithography is poor.

As such, there is a need to provide a method that is able of forming interconnect structures in which the pattern that is formed within the interconnect dielectric material is reduced below the resolution limit of current lithography techniques.

SUMMARY

The present application provides various methods for achieving advanced patterning of an interconnect dielectric material layer wherein the dimension, i.e., width, of an opening that is formed into a metallic hard mask layer is shrunk prior to extending the opening into the interconnect dielectric material layer. The shrinking of the dimension of the opening that is formed into the metallic hard mask layer can be achieved in the present application by forming at least a metallic hard mask spacer portion on a sidewall surface of each patterned metallic hard mask layer. The aforementioned basic principle can be applied to forming a line opening, a via opening and/or a combined via and line opening within an interconnect dielectric material layer, wherein each of the openings (line, via and/or via and line) has a reduced dimension as compared to that obtainable utilizing conventional lithography.

In one aspect of the present application, a method of forming an interconnect structure is provided that includes providing a structure including, from bottom to top, an interconnect dielectric material layer, a dielectric hard mask layer, and a metallic hard mask layer. Next, the metallic hard mask layer is patterned to provide metallic hard mask portions on the dielectric hard mask layer, wherein adjacent metallic hard mask portions are spaced apart by a first opening having a first width. The first width of the first opening is then reduced to provide a second opening having a second width. Next, the second opening having the second width is extended entirely through the dielectric hard mask layer and at least partially through the interconnect dielectric material layer to provide an interconnect dielectric material structure having the second opening with the second width.

In another aspect of the present application, a method of forming an interconnect structure is provided that includes providing a structure including, from bottom to top, an interconnect dielectric material layer, a dielectric hard mask layer, and a metallic hard mask layer. Next, the metallic hard mask layer is patterned to provide metallic hard mask portions on the dielectric hard mask layer, wherein adjacent metallic hard mask portions are spaced apart by a first opening having a first width. After patterning, a block mask is formed on a topmost surface of each metallic hard mask portion but not covering the first opening. Next, the first width of the first opening is then reduced to provide a second opening having a second width. The second opening having the second width is then extended entirely through the dielectric hard mask layer and at least partially through the interconnect dielectric material layer to provide an interconnect dielectric material structure having the second opening with the second width.

In a further aspect of the present application, a method of forming an interconnect structure is provided that includes providing a structure including, from bottom to top, an interconnect dielectric material layer, a dielectric hard mask layer, and a metallic hard mask layer. Next, the metallic hard mask layer is patterned to provide metallic hard mask portions on the dielectric hard mask layer, wherein adjacent metallic hard mask portions are spaced apart by a line opening having a first width. A block mask is then formed on a topmost surface of each metallic hard mask portion but not covering the line opening. Next, the first width of the line opening is reduced to provide a via opening having a second width by forming a metallic hard mask spacer portion on a sidewall surface of each metallic hard mask portion. The via opening having the second width is then extended entirely through the dielectric hard mask layer and at least partially through the interconnect dielectric material layer to provide an interconnect dielectric material structure having the via opening with the second width. Next, the metallic hard mask spacer portion is removed from the sidewall surface of each metallic hard mask portion to restore the line opening having the first width between the adjacent metallic hard mask portions. The line opening having the first width is then extended entirely through the dielectric hard mask layer and partially through the interconnect dielectric material structure. These steps provide an interconnect structure in which the line opening having the first width is located in an upper portion of the interconnect dielectric material structure and the via opening of the second width is located in a lower portion of the interconnect dielectric material structure.

DETAILED DESCRIPTION

Figure 1:
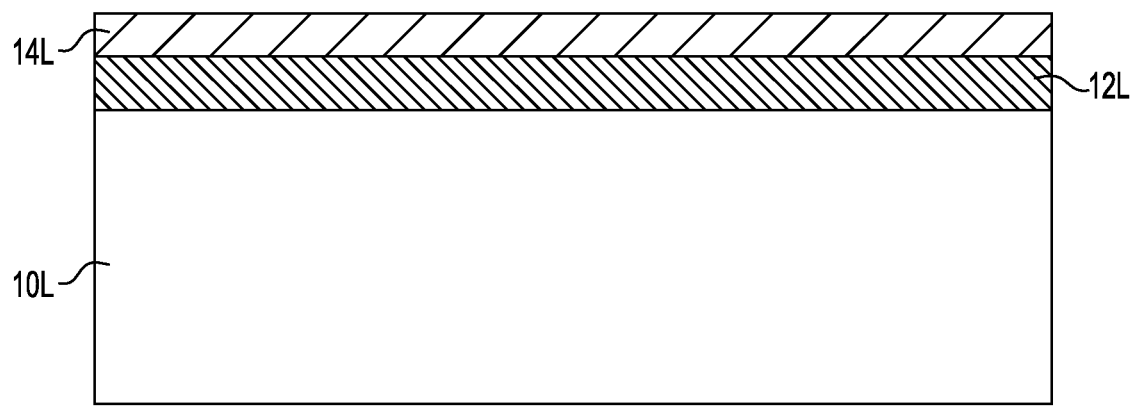
FIG. 1 is a cross sectional view of an exemplary semiconductor structure including, from bottom to top, an interconnect dielectric material layer, a dielectric hard mask layer, and a metallic hard mask layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As mentioned above, the present application provides methods for achieving advanced patterning of an interconnect dielectric material layer in which the dimension, i.e., width, of an opening that is formed into a metallic hard mask layer is shrunk prior to extending the opening into the interconnect dielectric material layer. The shrinking of the dimension of the opening that is formed into the metallic hard mask layer can be achieved in the present application by forming at least a metallic hard mask spacer portion on a sidewall surface of each patterned metallic hard mask layer. The aforementioned basic principle can be applied to forming a line opening, a via opening and/or a combined via and line opening within an interconnect dielectric material layer, wherein each of the openings (line, via and/or via and line) has a reduced dimension as compared to that obtainable utilizing conventional lithography.

Reference will be first made to FIGS. 1-6 which illustrate an embodiment of the present application in which a line opening or via opening, particularly a line opening, having a reduced width is formed partially within an interconnect dielectric material layer without utilizing an elaborate lithography process such as, for example, extreme ultra-violet (EUV) lithography.

Referring now to FIG. 1, there is illustrated an exemplary semiconductor structure including, from bottom to top, an interconnect dielectric material layer 10L, a dielectric hard mask layer 12L, and a metallic hard mask layer 14L that can be employed in accordance with an embodiment of the present application.

The interconnect dielectric material layer 10L may be located upon a substrate (not shown in the drawings of the present application). The substrate, which is not shown, may comprise a semiconductor material, an insulator material, a conductive material or any combination thereof. When the substrate is comprised of a semiconductor material, any semiconductor material such as, for example, Si, SiGe, SiGeC, SiC, Ge alloys, III/V or II/VI compound semiconductors may be used. In addition to these listed types of semiconductor materials, the present application also contemplates cases in which the semiconductor substrate is a layered semiconductor such as, for example, Si/SiGe, Si/SiC, silicon-on-insulators (SOIs) or silicon germanium-on-insulators (SGOIs). In some embodiments, and when the substrate is a semiconductor material, the semiconductor material may include one or more semiconductor devices such as, for example, complementary metal oxide semiconductor (CMOS) devices disposed thereon.

When the substrate is an insulator material, the insulator material can be an organic insulator, an inorganic insulator or a combination thereof including multilayers. In such an embodiment, the insulator material that can provide the substrate may serve as another interconnect level of a multilayered interconnect structure, a dielectric capping layer or any combination thereof.

When the substrate is a conductive material, the substrate may include, for example, polySi, an elemental metal, alloys of elemental metals, a metal silicide, a metal nitride or combinations thereof including multilayers. In some embodiments, the conductive material that provides the substrate may be a contiguous layer that extends beneath the entirety of the interconnect dielectric material layer 10L. In other embodiments, the conductive material that provides the substrate may be embedded within an insulator layer forming either another interconnect level of a multilayered interconnect structure, or a device contact level.

The interconnect dielectric material layer 10L can include any interlevel or intralevel dielectric including inorganic dielectrics or organic dielectrics. In one embodiment, the interconnect dielectric material layer 10L may be non-porous. In another embodiment, the interconnect dielectric material layer 10L may be porous. Porous dielectrics are advantageous since such dielectric materials when used as an interconnect dielectric material have lower dielectric constants than an equivalent non-porous dielectric material. Some examples of suitable dielectrics that can be used as the interconnect dielectric material layer 10L include, but are not limited to, silicon oxide (undoped silicate glass), doped silicon oxide (doped silicate glass), silsesquioxanes, C doped oxides (i.e., organosilicates) that include atoms of Si, C, O and H, thermosetting polyarylene ethers, or multilayers thereof. In some embodiments, the entirety of the interconnect dielectric material layer 10L contains a same interlevel or intralevel dielectric material. In other embodiments, the interconnect dielectric material layer 10L may comprise any number of interlevel or intralevel dielectric materials in which at least two of the interlevel or intralevel dielectric materials have a different composition. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the interconnect dielectric material layer 10L has a dielectric constant that is about 4.0 or less. In another embodiment, the interconnect dielectric material layer 10L has a dielectric constant of about 2.8 or less. All dielectric constants mentioned herein are relative to a vacuum, unless otherwise noted. The interconnect dielectric material layer 10L that is employed in the present application generally has a lower parasitic crosstalk as compared with dielectric materials that have a dielectric constant of greater than 4.0.

The interconnect dielectric material layer 10L can be formed by a deposition including, for example, chemical vapor deposition, plasma enhanced chemical vapor deposition, evaporation, and spin-coating. The thickness of the interconnect dielectric material layer 10L may vary depending upon the dielectric material used as well as the exact number of dielectric materials that provide the interconnect dielectric material layer 10L. In one embodiment, and for normal interconnect structures, the interconnect dielectric material layer 10L has a thickness from 50 nm to 1000 nm. In other embodiments, the interconnect dielectric material layer 10L can have a thickness that is above or below the aforementioned range.

After providing the interconnect dielectric material layer 10L, a dielectric hard mask layer 12L can be formed on a topmost surface of the interconnect dielectric material layer 10L. The dielectric hard mask layer 12L that is employed in the present application has an etch rate that differs from the underlying interconnect dielectric material layer 10L. Examples of dielectric materials that can be used as the dielectric hard mask layer 12L can include a dielectric oxide (including dielectric metal oxides), a dielectric nitride, a dielectric oxynitride or any multilayered combination thereof. In one embodiment, the dielectric material hard mask layer 12L is an oxide such as silicon dioxide, while in another embodiment the dielectric hard mask layer 12L is a nitride such as silicon nitride.

The dielectric hard mask layer 12L can be formed utilizing a deposition process including, for example, chemical vapor deposition (CVD), plasma enhanced chemical vapor deposition (PECVD), chemical solution deposition, evaporation, and physical vapor deposition (PVD). Alternatively, the dielectric hard mask layer 12L can be formed by one of thermal oxidation, and thermal nitridation. The dielectric hard mask layer 12L may have a thickness from 5 nm to 100 nm. Other thicknesses that are greater than or lesser than the thickness range mentioned above can also be employed for the dielectric hard mask layer 12L.

After providing the dielectric hard mask layer 12L, a metallic hard mask layer 14L can be formed on a topmost surface of the dielectric hard mask layer 12L. The metallic hard mask layer 14L can be an elemental metal layer, an intermetallic alloy layer, a metallic nitride layer, a metallic carbide layer, or a combination or a stack thereof. The metallic hard mask layer 14L can be a single layer having a homogenous composition throughout, or can be a stack of multiple layers each having a homogeneous composition therein.

Non-limiting examples of elemental metals that can be employed for an elemental metal material within the metallic hard mask layer 14L include W, Ti, Ta, Al, Ni, Co, Au, and Ag. Non-limiting examples of elemental metals that can be employed in an intermetallic alloy within the metallic hard mask layer 14L include W, Ti, Ta, Al, Ni, Co, Au, and Ag. Non-limiting examples of metallic nitrides that can be employed in a metallic nitride within the metallic hard mask layer 14L include WN, TiN, TaN, and AlN. Non-limiting examples of metallic carbides that can be employed in a metallic carbide within the metallic hard mask layer 14L include WC, TiC, and TaC. In one embodiment, the metallic hard mask layer 14L can consist essentially of a metallic nitride. In one embodiment, the metallic hard mask layer 14L can consist essentially of TiN.

The metallic hard mask layer 14L can be deposited employing any deposition method known in the art for the material(s) selected for the metallic hard mask layer 14L. Deposition methods that can be employed to form the metallic hard mask layer 14L include, but are not limited to, physical vapor deposition, vacuum evaporation, chemical vapor deposition (CVD), molecular beam deposition (MBD), pulsed laser deposition (PLD), liquid source misted chemical deposition (LSMCD), and atomic layer deposition (ALD). The thickness of the metallic hard mask layer 14L can be from 3 nm to 30 nm, although lesser and greater thicknesses can also be employed.

Figure 2:
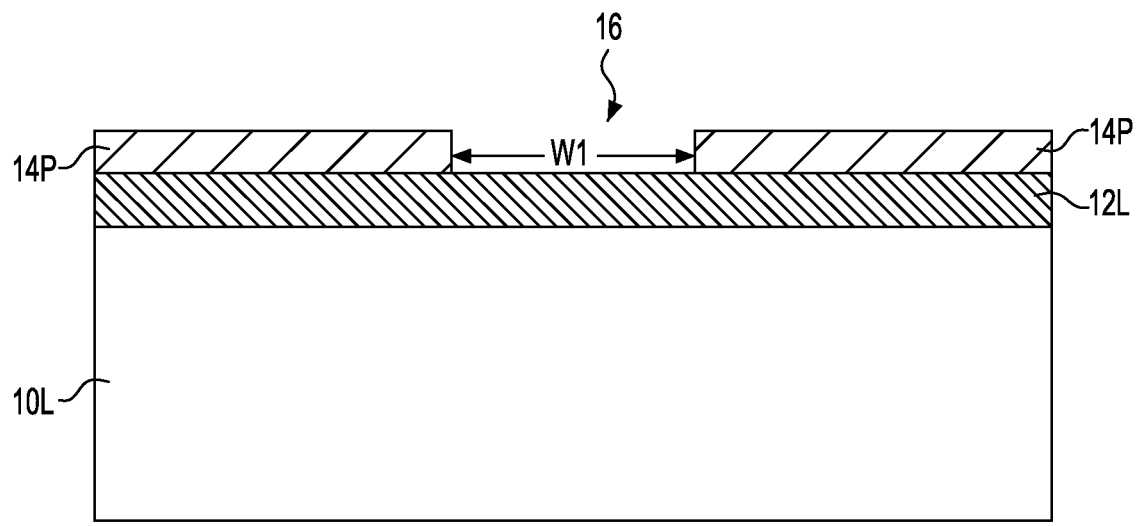
FIG. 2 is a cross sectional view of the exemplary semiconductor structure of FIG. 1 after providing a first opening having a first width within the metallic hard mask layer.

Referring now to FIG. 2, there is illustrated the exemplary semiconductor structure of FIG. 1 after providing a first opening 16 having a first width, w1, within the metallic hard mask layer 14L. Notably, FIG. 2 illustrates the structure of FIG. 1 after the metallic hard mask layer 14L is patterned to provide metallic hard mask portions 14P on the dielectric hard mask layer 12L, wherein adjacent metallic hard mask portions 14P are spaced apart by a first opening 16 having a first width, w1.

The portions of the metallic hard mask layer 14L that remain on the surface of the dielectric hard mask layer 12L after forming the first opening 16 are referred to herein as metallic hard mask portions 14P. As is shown, the first opening 16 exposes a portion of a topmost surface of the dielectric hard mask layer 12L. As is also shown, each metallic hard mask portion 14P has an exposed sidewall surface within the first opening 16. It is noted that although a single first opening 16 is described and illustrated, a plurality of first openings can be formed into the metallic hard mask layer 14L. When a plurality of first openings is formed, the openings are laterally spaced from one another.

The first opening 16 can be formed into the metallic hard mask layer 14L by lithography and etching. The lithographic process can include forming a photoresist (not shown) on an exposed topmost surface of the metallic hard mask layer 14L, exposing the photoresist to a desired pattern of radiation and developing the exposed photoresist utilizing a conventional resist developer. The pattern is then transferred into the metallic hard mask layer 14L by an anisotropic etching process. The etching can include a dry etching process (such as, for example, reactive ion etching, ion beam etching, plasma etching or laser ablation), and/or a wet chemical etching process. Typically, reactive ion etching is used in providing the first opening 16. After patterning the underlying metallic hard mask layer 14L to provide the metallic hard mask portions 14P, the patterned photoresist can be removed utilizing a conventional stripping process such as, for example, ashing.

The first opening 16 that is provided into the metallic hard mask layer 14L can be can be a via opening or a line opening. As is known, a via opening has a width that is less than a width of the line opening. Notwithstanding the type of first opening 16 provided into the metallic hard mask layer 14L, the first opening 16 that is typically provided has a first width, w1, which may range from 30 nm to 200 nm. The first width, w1, of the first opening 16 that is provided at this stage of the present application is dependent on the type of lithographic process that is used in forming the same.

Figure 3:
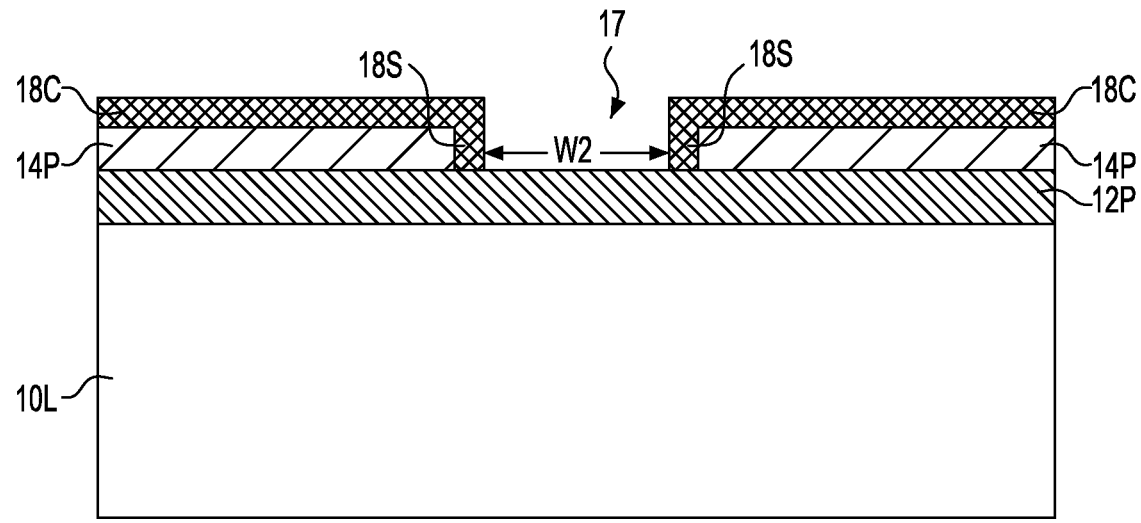
FIG. 3 is a cross sectional view of the exemplary semiconductor structure of FIG. 2 after reducing the first width of the first opening to provide a second opening having a second width by forming a metallic hard mask structure comprising at least a metallic hard mask spacer portion on exposed sidewall surfaces of each metallic hard mask portion and within a portion of the first opening.

Referring now to FIG. 3, there is illustrated the exemplary semiconductor structure of FIG. 2 after reducing the first width, w1, of the first opening 16 to provide a second opening 17 having a second width, w2. The reduction of the width of the first opening 16 can be obtained by forming a metallic hard mask structure comprising at least a metallic hard mask spacer portion 18S located on exposed sidewall surfaces of each metallic hard mask portion 14P and within a portion of the first opening 16. In some embodiments of the present application, and as is illustrated in FIG. 3, the metallic hard mask structure also includes a metallic hard mask cap portion 14C. As is shown, the metallic hard mask cap portion 18C extends outside the first opening 16 and is present on the topmost surface of each previously formed metallic hard mask portion 14P.

The metallic hard mask spacer portion 18S and the metallic hard mask cap portion 18C are of unitary construction, i.e., they each comprise a same metallic hard mask material and thus lack any interface between them.

The metallic hard mask structure including the metallic hard mask spacer portion 18S and the metallic hard mask cap portion 18C may comprise one of the metallic materials mentioned above for metallic hard mask layer 14L. In one embodiment of the present application, the metallic hard mask structure including the metallic hard mask spacer portion 18S and the metallic hard mask cap portion 18C may comprise a same metallic hard mask material as the metallic hard mask layer 14L. In another embodiment of the present application, the metallic hard mask structure including the metallic hard mask spacer portion 18S and the metallic hard mask cap portion 18C may comprise a different metallic hard mask material as the metallic hard mask layer 14L.

The metallic hard mask structure including the metallic hard mask spacer portion 18S and the metallic hard mask cap portion 18C can be formed utilizing a selective deposition process. The selective deposition of the metallic hard mask structure occurs only on exposed surfaces of the metallic hard mask portions 14P. Thus, the exposed surfaces of the metallic hard mask portions 14P serve as a seed layer for selectively depositing the metallic hard mask structure.

Examples of selective deposition processes that can be used in providing the metallic hard mask structure include, but are not limited to, CVD, plasma enhanced CVD, and ALD. In one embodiment of the present application, the selective deposition of the metallic hard mask structure may occur at a deposition temperature of from 80° C. to 350° C. Other deposition temperatures can also be used provided that the deposition temperature is capable of selectively depositing the metallic hard mask structure on the exposed surfaces of each metallic hard mask portion 14P. The thickness of the metallic hard mask structure 18C, 18S can be from 1 nm to 50 nm, although lesser and greater thicknesses can also be employed.

As stated above, the metallic hard mask spacer portion 18S is located on exposed sidewall surfaces of each metallic hard mask portion 14P, within the first opening 16 and on a portion of a topmost surface of the underlying dielectric hard mask layer 12L. The metallic hard mask spacer portion 18S does not completely fill the first opening 16, but instead, the metallic hard mask spacer portion 18S partially fills the first opening 16 with a metallic hard mask material; this partially filling of the first opening 16 with the metallic hard mask spacer portion results in the formation of the second opening 17 having the second width, w2. The metallic hard mask spacer portion 18S reduces the width of the first opening 16 from the first width, w1, to a second width, w2; i.e., w2<w1. In one embodiment of the present application, w2 is from 5 nm to 30 nm. In another embodiment of the present application, w2 is from 10 nm to 20 nm. For a line opening, w2 is from 5 nm to 30 nm. Other widths for w2 are possible as long as w2<w1. It is noted that the reduction of the width of the first opening 16 is formed without utilizing any exotic lithographic process such as, for example, EUV lithography.

Figure 4:
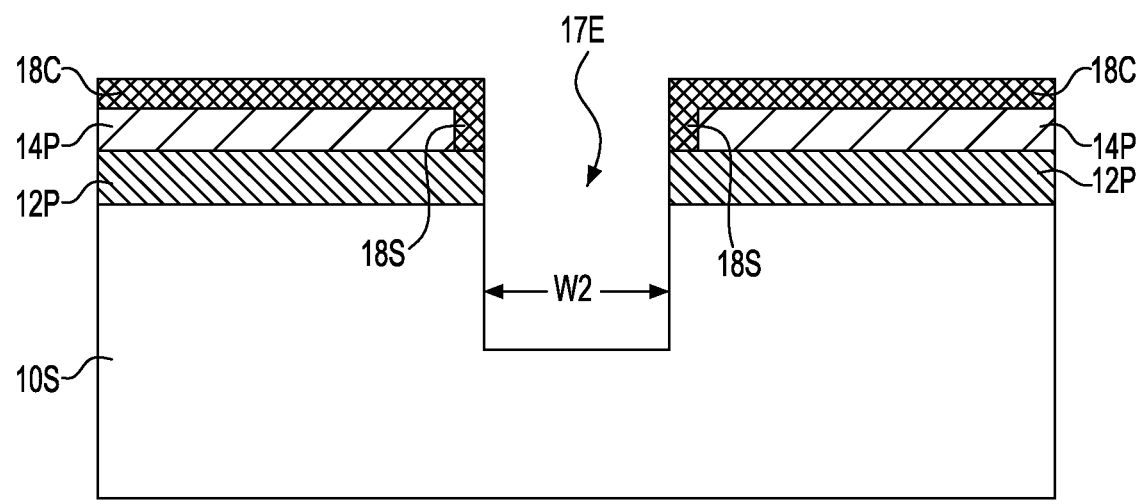
FIG. 4 is a cross sectional view of the exemplary semiconductor structure of FIG. 3 after extending the second opening having the second width through the dielectric hard mask layer and at least a portion of the interconnect dielectric material layer.

Referring now to FIG. 4, there is illustrated the exemplary semiconductor structure of FIG. 3 after extending the second opening 17 having the second width, w2, through the dielectric hard mask layer 12L and at least a portion of the interconnect dielectric material 10L. The extended opening having the width, w2, is labeled as element 17E in the drawings of the present application. The extended opening 17E has a width equal to w2. The interconnect dielectric material layer 10L that includes the extended opening 17E can now be referred to as an interconnect dielectric material structure 10S. Each remaining portion of the dielectric hard mask layer 12L can be referred to herein as a dielectric hard mask portion 12P.

In some embodiments of the present application, and as is illustrated, the extended opening 17E has a bottommost surface that is located within a portion of the interconnect dielectric material structure 10S. In such an embodiment, the extended opening 17E is formed partially, but not completely, through the interconnect dielectric material layer 10L such that the bottommost surface of the extended opening 17E contacts a dielectric surface of the interconnect dielectric material structure 10S. In other embodiments (not shown), the extended opening 17E is formed entirely, i.e., completely, through the interconnect dielectric material layer 10L such that the bottommost surface of the extended opening contacts a surface of an underlying substrate. The surface of the underlying substrate may be a topmost surface of the substrate or any sub-surface that is located beneath the topmost surface of the substrate.

The extending of the second opening 17 having the second width, w2, through the dielectric hard mask layer 12L and at least a portion of the interconnect dielectric material 10L comprises at least one etching process in which the remaining metallic hard mask materials (i.e., 18S and 18C) serve as an etch mask. The at least one etch that is used to extend the second opening 17 having the second width, w2, through the dielectric hard mask layer 12L and at least a portion of the interconnect dielectric material 10L comprises an anisotropic etching process. In one embodiment, at least one of the etching processes used in extending the second opening 17 having the second width, w2, through the dielectric hard mask layer 12L and at least a portion of the interconnect dielectric material 10L includes a reactive ion etching (RIE) process.

Figure 5:
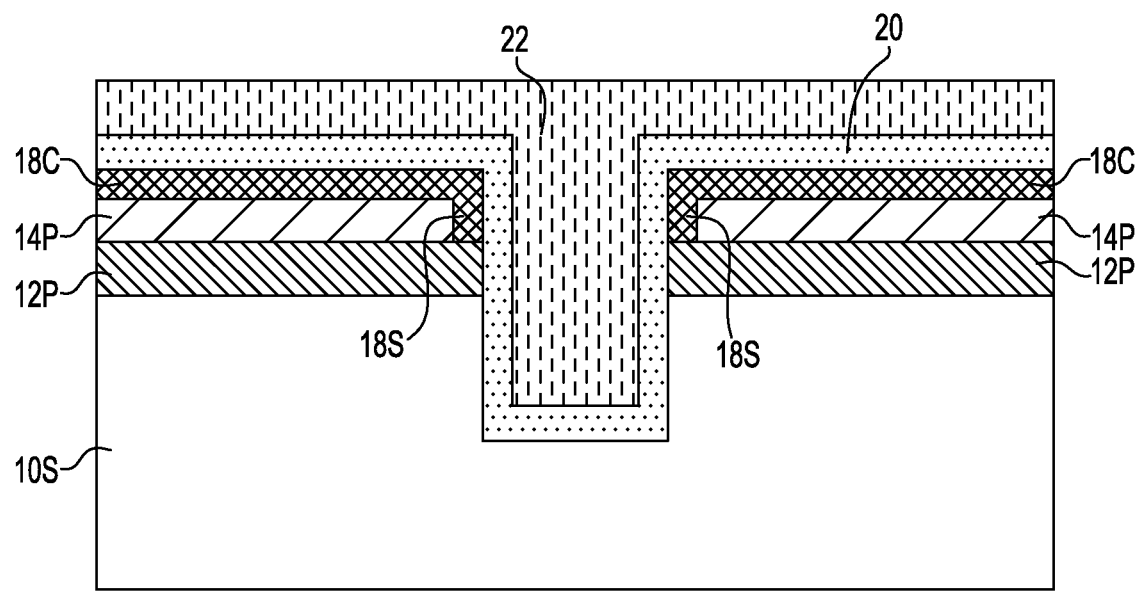
FIG. 5 is a cross sectional view of the exemplary semiconductor structure of FIG. 4 after providing a diffusion barrier layer and a conductive material.

Referring now to FIG. 5, there is illustrated the exemplary semiconductor structure of FIG. 4 after providing a diffusion barrier layer 20 and a conductive material 22. As is shown, a contiguous diffusion barrier layer 20 is formed first, and then the conductive material 22 is formed. Thus, and in the illustrated embodiment, the diffusion barrier layer 22 contacts portions of the interconnect dielectric material structure 10S, sidewall surfaces of the metallic hard mask spacer portion 18S, and sidewall surfaces and a topmost surface of the metallic hard mask cap portion 18C. The conductive material 22 contacts only an exposed topmost surface of the diffusion barrier layer 20.

The diffusion barrier layer 20 includes Co, Ir, Pt, Pd, Ta, Rh, TaN, Ti, TiN, Ru, RuN, RuTa, RuTaN, W, WN or any other material that can serve as a barrier to prevent a conductive material from diffusing there through. In one embodiment, the diffusion barrier layer 20 may comprise a single layered structure. In another embodiment, the diffusion barrier layer 20 may comprise a multilayered structure, e.g., a bilayered structure, including at least two different diffusion barrier materials formed one atop another. The thickness of the diffusion barrier layer 20 may vary depending on the deposition process used as well as the material employed. In one embodiment, the diffusion barrier layer 20 has a thickness from 2 nm to 50 nm. In another embodiment, the diffusion barrier layer 20 has a thickness from 5 nm to 20 nm.

The diffusion barrier layer 20 can be formed by a deposition process including, for example, chemical vapor deposition (CVD), plasma enhanced chemical vapor deposition (PECVD), atomic layer deposition (ALD), and physical vapor deposition (PVD).

In some embodiments (not shown), an adhesion/plating seed layer may also be formed atop the diffusion barrier layer 20; in embodiments when the adhesion/plating seed layer is used, reference numeral 20 can also be used to represent a material stack including both diffusion barrier material and the optional adhesion/plating seed material. When employed, the optional adhesion/plating seed layer is comprised of a metal or metal alloy from Group VIIIA of the Periodic Table of Elements. Examples of suitable Group VIIIA elements for the adhesion/plating seed layer include, but are not limited to, Ru, TaRu, Ir, Co, Rh, Pt, Pd and alloys thereof. In some embodiments, it is preferred to use Ru, Ir or Rh as the optional adhesion/plating seed layer. The optional adhesion/plating seed layer is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the optional adhesion/plating seed layer may vary depending on a number of factors including, for example, the compositional material of the adhesion/plating seed layer and the technique that was used in forming the same. Typically, the optional adhesion/plating seed layer has a thickness from 0.5 nm to 10 nm, with a thickness of less than 6 nm being even more typical.

The conductive material 22 that is formed may comprise a doped Si-containing material, an elemental metal, alloys of elemental metals, a metal silicide, a metal nitride or combinations thereof including multilayers. In one embodiment of the present application, conductive material 22 includes Cu, Al, W or alloys thereof. Of these metallic materials, the conductive material 22 is typically comprised of Cu or an Al—Cu alloy.

Conductive material 22 can be formed utilizing a deposition process such as, for example, CVD, PECVD, physical vapor deposition (PVD), sputtering, plating, chemical solution deposition and electroless plating. As is shown, both the diffusion barrier layer 20 and the conductive material 22 are present within and outside the extended opening 17E.

Figure 6:
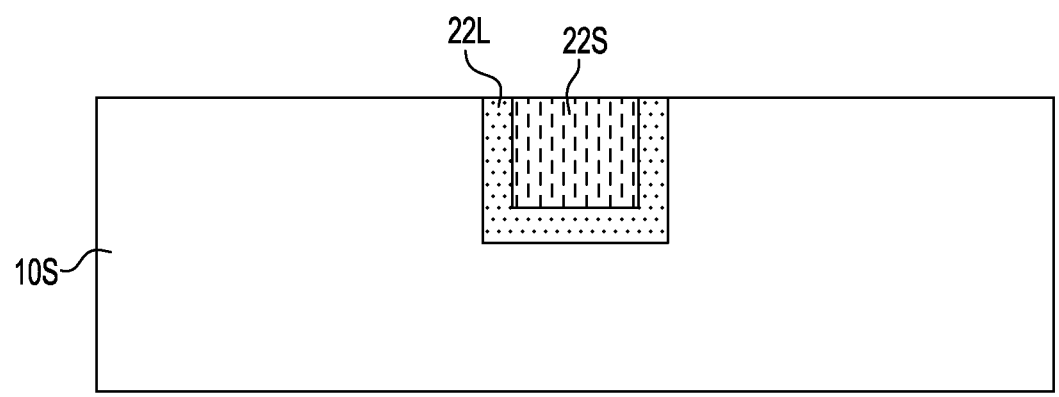
FIG. 6 is a cross sectional view of the exemplary semiconductor structure of FIG. 5 after performing a planarization process.

Referring now to FIG. 6, there is illustrated the exemplary semiconductor structure of FIG. 5 after performing a planarization process. The planarization process may include chemical mechanical planarization (often also referred to as chemical mechanical polishing) and/or grinding. The planarization process provides a planar interconnect structure as shown in FIG. 6. The planar interconnect structure includes interconnect dielectric material structure 10S, and remaining portions of the diffusion barrier layer 20 and remaining portions of the conductive material 22 located in the extended opening 17E that is present in the interconnect dielectric material structure 10S. The remaining portion of the diffusion barrier layer 20 is herein after referred to as a diffusion barrier liner 20L, while the remaining portion of the conductive material 22 is herein after referred to as a conductive material structure 22S. As is shown, the diffusion barrier liner 20L is now U-shaped and completely separates the conductive material structure 22S from the interconnect dielectric material structure 10S. Also, and as shown in FIG. 6, each of the diffusion barrier liner 20L and the conductive material structure 22S has a topmost surface that is coplanar with a topmost surface of the interconnect dielectric material structure 10S. The conductive material structure 22S has a shape and dimension of either a metallic line or a metallic via. Typically, this embodiment of the present application can be used in forming a conductive material structure 22S having a shape and dimension of a metallic line.

The planarization process that is employed in the present application to provide the planar structure illustrated in FIG. 6 thus removes portions of the conductive material 22 and portions of the diffusion barrier layer 20 that are present outside the extended opening 17E and atop each metallic hard mask cap portion 18C. Also, the planarization process removes the entirety of the metallic hard mask structure (including each metallic hard mask cap portion 18C and each metallic hard mask spacer portion 18S), the entirety of each metallic hard mask portion 14P, and the entirety of each dielectric hard mask portion 12P.

In some embodiments (not shown), a metallic cap and/or a dielectric cap can be formed. In other embodiments (also not shown), another interconnect dielectric material layer can be formed and processed as outline above.

In some embodiments of the present application (not illustrated), the planarization process may stop on the topmost surface of each dielectric hard mask portion 12P, and then a metallic cap and/or a dielectric cap may be formed to cover the exposed topmost surfaces of the diffusion barrier liner 20L and the conductive structure 22S.

Reference is now made to FIGS. 7-11 which illustrate another embodiment of the present application in which a line opening or via opening, particularly a via opening, having a reduced width is formed partially within an interconnect dielectric material layer without utilizing an elaborate lithography process such as, for example, EUV lithography.

Figure 7:
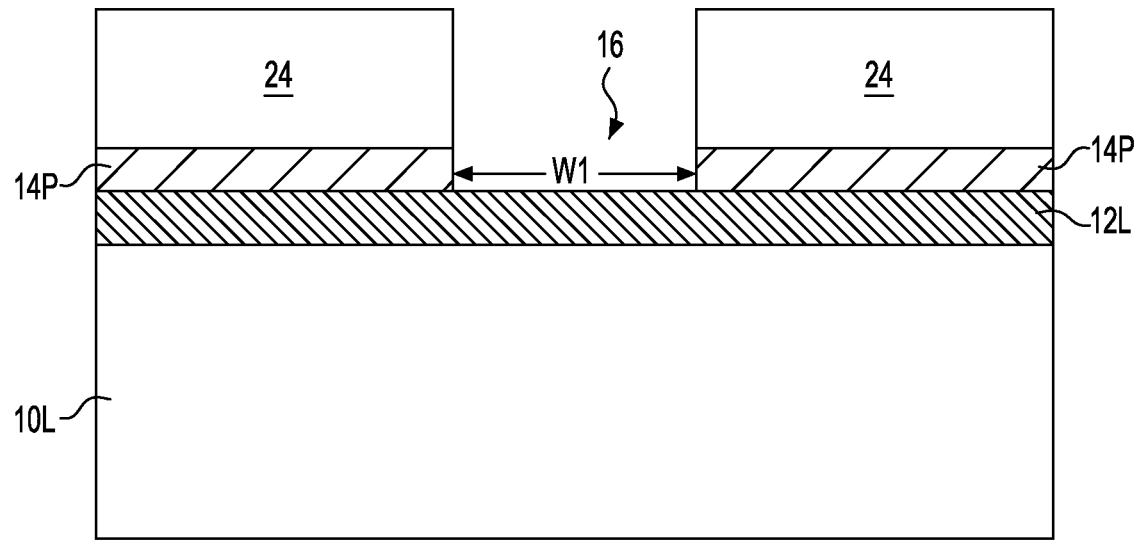
FIG. 7 is a cross sectional view of the exemplary semiconductor structure of FIG. 2 after forming a block mask on a topmost surface of each metallic hard mask portion in accordance with another embodiment of the present application.

Referring first to FIG. 7, there is illustrated the exemplary semiconductor structure of FIG. 2 after forming a block mask 24 on a topmost surface of each metallic hard mask portion 14P in accordance with another embodiment of the present application. In the illustrated embodiment, the block mask 24 does not cover the first opening 16. In other embodiments and when a plurality of openings (not shown) are formed in the metallic hard mask layer 14L, the block mask may cover a first set of first openings, while leaving a second set of first openings uncovered.

The block mask 24 that can be used in the present application may include any block mask material that has a different etch rate than either the metallic hard mask layer 14L or the dielectric hard mask layer 12L. In one embodiment of the present application, the block mask 24 may be comprised of a photoresist material.

As is shown, the block mask 24 includes an opening therein that has a width that is equal to the first width, w1, of first opening 16 that was provided into the metallic hard mask layer 14L. As such, the entire topmost surface of each metallic hard mask portion 14P includes the block mask 24. Furthermore, the block mask 24 has sidewall surfaces, i.e., edges, which are vertically coincident with the sidewall surfaces of each metallic hard mask portion 14P.

The block mask 24 can be formed by first depositing a block mask material, e.g., photoresist material, and then subjecting the deposited block mask material to lithography as described above. In one embodiment, the block mask material that is used in providing the block mask 24 is a photoresist material, and the photoresist material is deposited by a spin-on deposition process.

Figure 8:
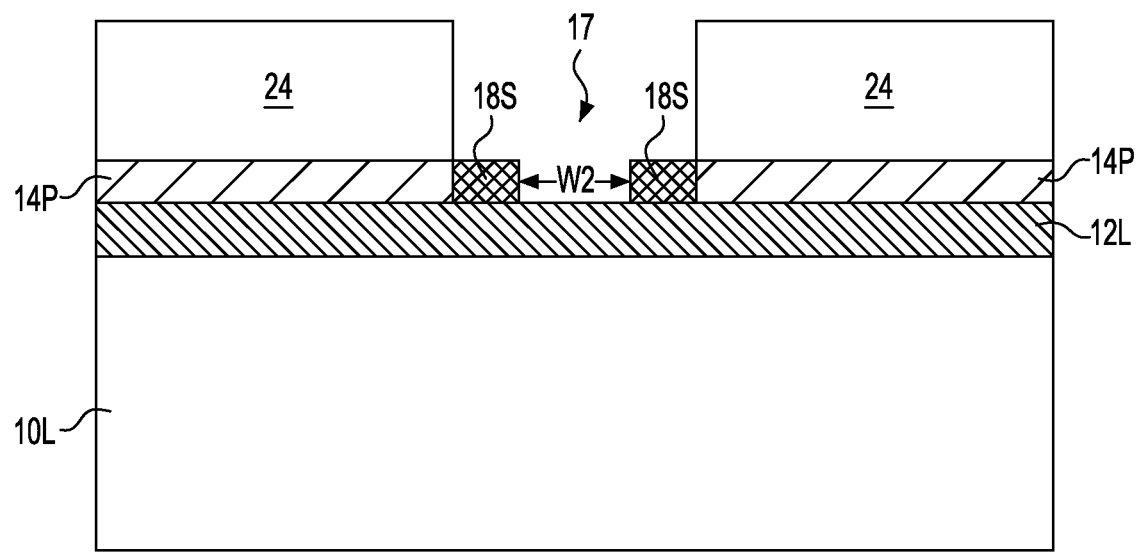
FIG. 8 is a cross sectional view of the exemplary semiconductor structure of FIG. 7 after reducing the first width of the first opening to provide a second opening having a second width by forming a metallic hard mask spacer portion on exposed sidewall surfaces of each metallic hard mask portion and within a portion of the first opening.

Referring now FIG. 8, there is illustrated the exemplary semiconductor structure of FIG. 7 after reducing the first width, w1, of the first opening 16 to provide a second opening 17 having a second width, w2. The reduction of the width of the first opening 16 can be obtained by forming a metallic hard mask spacer portion 18S on exposed sidewall surfaces of each metallic hard mask portion 14P, within a portion of the first opening 16 and on a portion of the underlying dielectric hard mask layer 12L. In this embodiment of the present application, and due to the presence of the block mask 24, no metallic hard mask cap portion 18C is formed as was the case in the previous embodiment of the present application. Thus, and in this embodiment, the metallic hard mask spacer portion 18S itself provides a metallic hard mask structure that is formed on the exposed sidewall surfaces of each metallic hard mask portion 14P. As is shown, and as mentioned in the previous embodiment of the present application, the metallic hard mask spacer portion 18S does not completely fill the first opening 16.

The metallic hard mask spacer portion 18S that is formed in this embodiment of the present application includes one of the metallic hard mask materials mentioned above in forming the metallic hard mask structure 18C, 18S. Also, the metallic hard mask spacer portion 18S of this embodiment of the present application can be formed utilizing a selective deposition processes as mentioned above.

The metallic hard mask spacer portion 18S reduces the width of first opening 16 from the first width, w1, to provide a second opening 17 with a second width, w2; i.e., w2<w1. In one embodiment of the present application, w2 is from 5 nm to 30 nm. In another embodiment of the present application, w2 is from 10 nm to 20 nm. For a via opening, w2 is from 5 nm to 30 nm. Other widths for w2 are possible as long as w2<w1. It is noted that the reduction of the width of the second opening 17 is formed without utilizing any exotic lithographic process such as, for example, EUV lithography.

Figure 9:
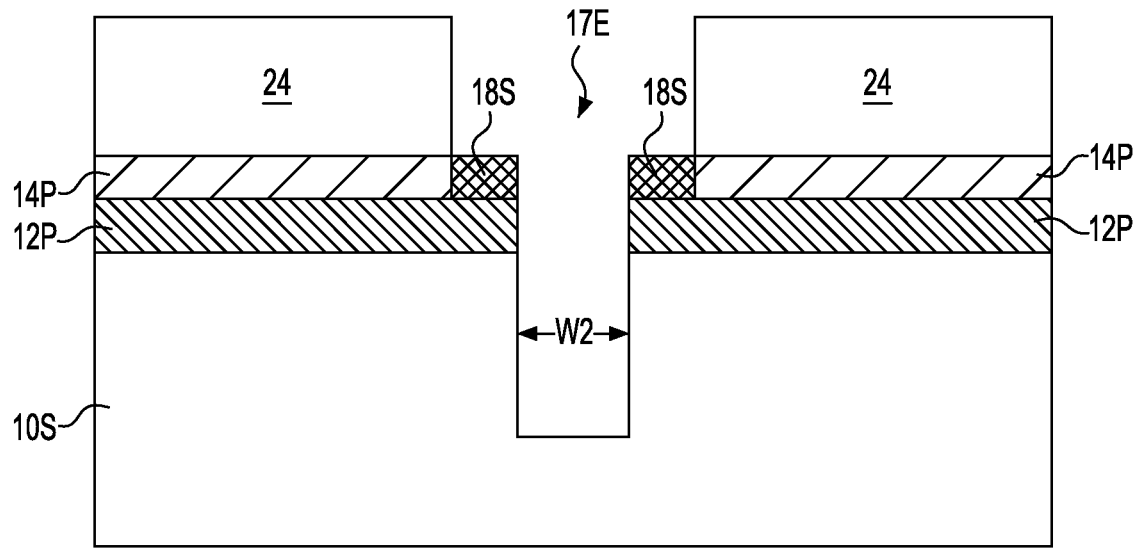
FIG. 9 is a cross sectional view of the exemplary semiconductor structure of FIG. 8 after extending the second opening having the second width through the dielectric hard mask layer and at least a portion of the interconnect dielectric material layer.

Referring now to FIG. 9, there is illustrated the exemplary semiconductor structure of FIG. 8 after extending the second opening 17 having the second width, w2, through the dielectric hard mask layer 12L and at least a portion of the interconnect dielectric material 10L. The extended opening is labeled as 17E in the drawings, and the interconnect dielectric material layer 10L that includes the extended opening 17E is again referred to as an interconnect dielectric material structure 10S. The second opening 17E has a width equal to w2.

In some embodiments of the present application, and as is illustrated, the extended opening 17E has a bottommost surface that is located within a portion of the interconnect dielectric material structure 10S. In such an embodiment, the extended opening 17E is formed partially, but not completely, through the interconnect dielectric material layer 10L such that the bottommost surface of the extended opening contacts a dielectric surface of the interconnect dielectric material structure 10S. In other embodiments (not shown), the extended opening 17E is formed entirely, i.e., completely, through the interconnect dielectric material layer 10L such that the bottommost surface of the extended opening contacts a surface of an underlying substrate. The surface of the underlying substrate may be a topmost surface of the substrate or any sub-surface that is located beneath the topmost surface of the substrate.

The extending of the second opening 17 having the second width, w2, through the dielectric hard mask layer 12L and at least a portion of the interconnect dielectric material 10L comprises at least one etching process in which each metallic hard mask spacer 18S and the block mask 24 serve as an etch mask. The at least one etch that is used to extend the second opening 17 having the second width, w2, through the dielectric hard mask layer 12L and at least a portion of the interconnect dielectric material 10L comprises an anisotropic etching process. In one embodiment, at least one of the etching processes used in extending the second opening 17 having the second width, w2, through the dielectric hard mask layer 12L and at least a portion of the interconnect dielectric material 10L includes a reactive ion etching (RIE) process.

Figure 10:
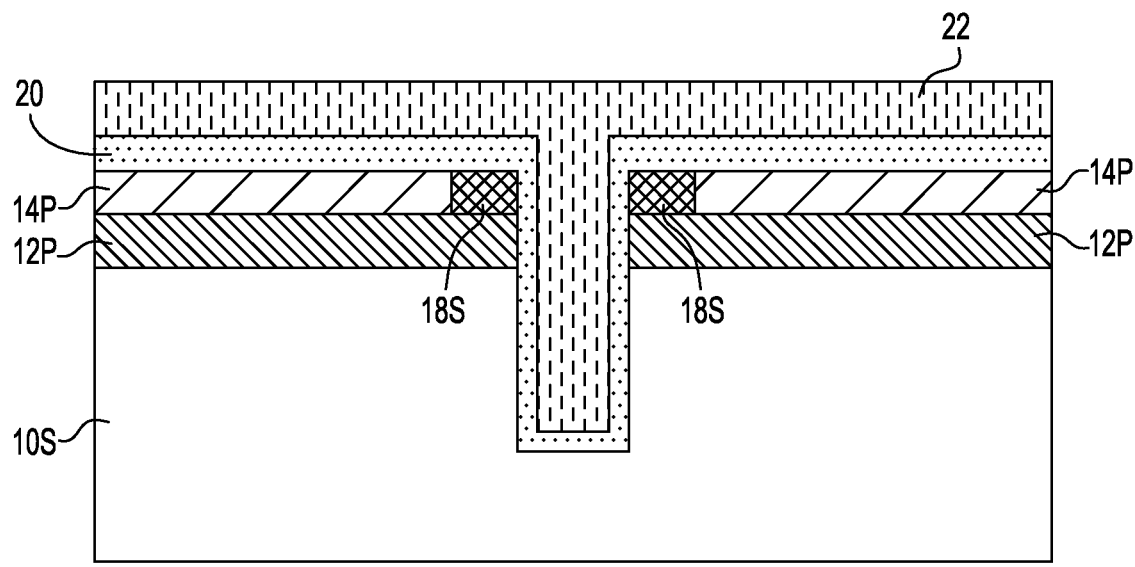
FIG. 10 is a cross sectional view of the exemplary semiconductor structure of FIG. 9 after removing the block mask, and providing a diffusion barrier layer and a conductive material.

Referring now to FIG. 10, there is illustrated the exemplary semiconductor structure of FIG. 9 after removing the block mask 24, and providing a diffusion barrier layer 20 and a conductive material 22. The block mask 24 can be removed utilizing any material removal process that selectively removes the block mask material from the structure relative to the underlying material layers (or portions). In one embodiment and when a photoresist is employed as the block mask material, a resist stripping process such as, for example, ashing may be used in removing the block mask 24 from the structure.

After removing the block mask 24 from the structure, diffusion barrier layer 20 and conductive material 22 are formed. The diffusion barrier layer 20 and the conductive material 22 of this embodiment of the present application are the same as mentioned above in the previous embodiment of the present application. Thus, the above description with respect to both the diffusion barrier layer 20 and the conductive material 22 is incorporated herein by reference.

Figure 11:
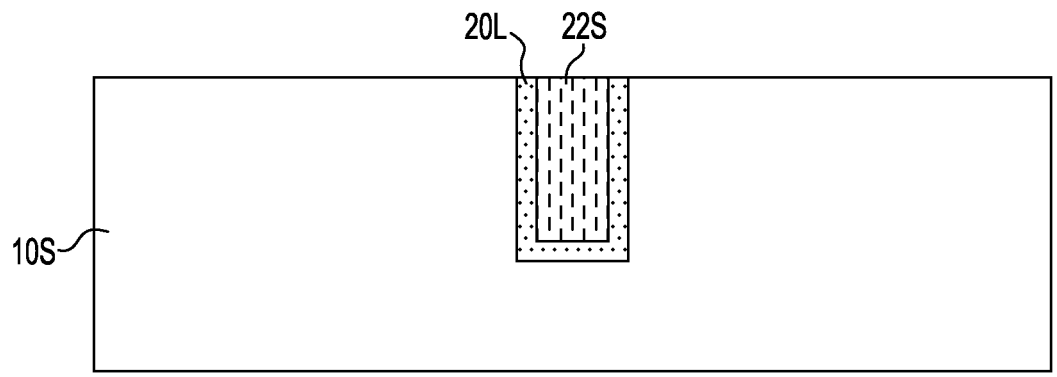
FIG. 11 is a cross sectional view of the exemplary semiconductor structure of FIG. 10 after performing a planarization process.

Referring now to FIG. 11, there is illustrated the exemplary semiconductor structure of FIG. 10 after performing a planarization process. The planarization process may include chemical mechanical planarization (often also referred to as chemical mechanical polishing) and/or grinding. The planarization process provides a planar interconnect structure as shown in FIG. 11. The planar interconnect structure includes interconnect dielectric material structure 10S, and remaining portions of the diffusion barrier layer 20 and remaining portions of the conductive material 22 within the extended opening 17E that is present in the interconnect dielectric material structure 10S. The remaining portion of the diffusion barrier layer 20 is herein after referred to as a diffusion barrier liner 20L, while the remaining portion of the conductive material 22 is herein after referred to as a conductive material structure 22S. As is shown, the diffusion barrier liner 20L is now U-shaped and completely separates the conductive material structure 22S from the interconnect dielectric material structure 10S. Also, and as shown in FIG. 11, each of the diffusion barrier liner 20L and the conductive material structure 22S has a topmost surface that is coplanar with a topmost surface of the interconnect dielectric material structure 10S. The conductive material structure 22S has a shape and dimension of either a metallic line or a metallic via. Typically, this embodiment of the present application can be used in forming a conductive material structure 22S having a shape and dimension of a metallic via.

The planarization process that is employed in the present application to provide the planar structure illustrated in FIG. 11 thus removes portions of the conductive material 22 and portions of the diffusion barrier layer 20 that are present outside the extended opening 17E. Also, the planarization process removes the entirety of each metallic hard mask spacer portion 18S, the entirety of each metallic hard mask portion 14P, and the entirety of each dielectric hard mask portion 12P.

In some embodiments (not shown), a metallic cap and/or a dielectric cap can be formed. In other embodiments (also not shown), another interconnect dielectric material layer can be formed and processed as outline above.

In some embodiments of the present application (not illustrated), the planarization process may stop on the topmost surface of each dielectric hard mask portion 12P, and then a metallic cap and/or a dielectric cap may be formed to cover the exposed topmost surfaces of the diffusion barrier liner 20L and the conductive structure 22S.

Reference is now first made to FIGS. 12-19 which illustrate another embodiment of the present application in which a combined via opening and line opening are formed partially within an interconnect dielectric material layer without utilizing an elaborate lithography process such as, for example, EUV lithography.

Figure 12:
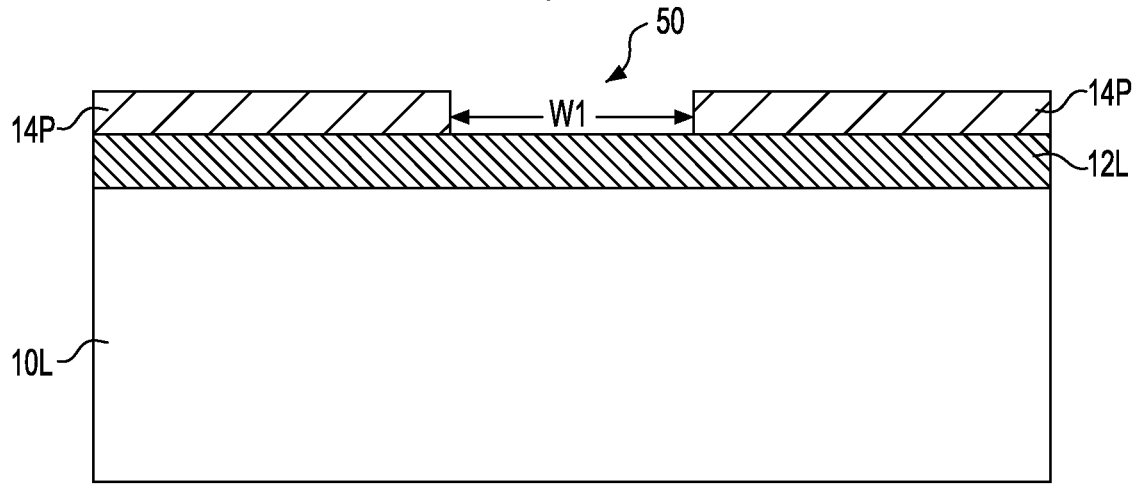
FIG. 12 is a cross sectional view of the exemplary semiconductor structure of FIG. 1 after providing a line opening having a first width within the metallic hard mask layer in accordance with an alternative embodiment of the present application.

Referring now to FIG. 12, there is illustrated the exemplary semiconductor structure of FIG. 1 after providing a line opening 50 having a first width, w1, within the metallic hard mask layer 14L. Notably, FIG. 12 illustrates the structure of FIG. 1 after the metallic hard mask layer 14L is patterned to provide metallic hard mask portions 14P on the dielectric hard mask layer 12L, wherein adjacent metallic hard mask portions 14P are spaced apart by a line opening 50 having a first width, w1.

As is shown, the line opening 50 exposes a portion of a topmost surface of the dielectric hard mask layer 12L. In this embodiment, w1 of the line opening 50 is from 30 nm to 200 nm, and more typically from 40 nm to 60 nm. The line opening 50 can be formed utilizing lithography and etching as described above in forming first opening 16 in the previous embodiments of the present application.

Figure 13:
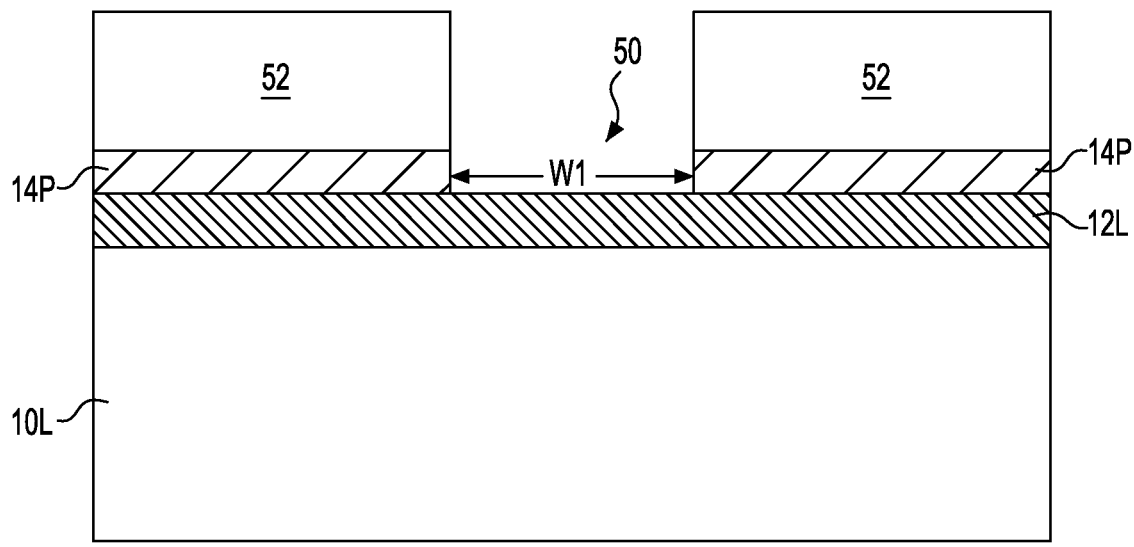
FIG. 13 is a cross sectional view of the exemplary semiconductor structure of FIG. 12 after providing a block mask covering portions of the structure not including the line opening.

Referring now to FIG. 13, there is illustrated the exemplary semiconductor structure of FIG. 12 after providing a block mask 52. As is shown, block mask 52 is formed on a topmost surface of each metallic hard mask portion 14P. In the illustrated embodiment, the block mask 52 does not cover the line opening 50. In other embodiments and when a plurality of openings (not shown) are formed in the metallic hard mask layer 14L, the block mask may cover a first set of openings, while leaving a second set of openings uncovered.

As is shown, the block mask 52 includes an opening therein that has a width that is equal to the first width, w1, of line opening 50 that was provided into the metallic hard mask layer 14L. As such, the entire topmost surface of each metallic hard mask portion 14P includes the block mask 52. Furthermore, the block mask 52 has sidewall surfaces, i.e., edges, which are vertically coincident with the sidewall surfaces of each metallic hard mask portion 14P.

The block mask 52 that is used in this embodiment of the present application can include one of block mask materials mentioned above for block mask 24. Also, block mask 52 can be formed utilizing the technique mentioned above in forming block mask 24.

Figure 14:
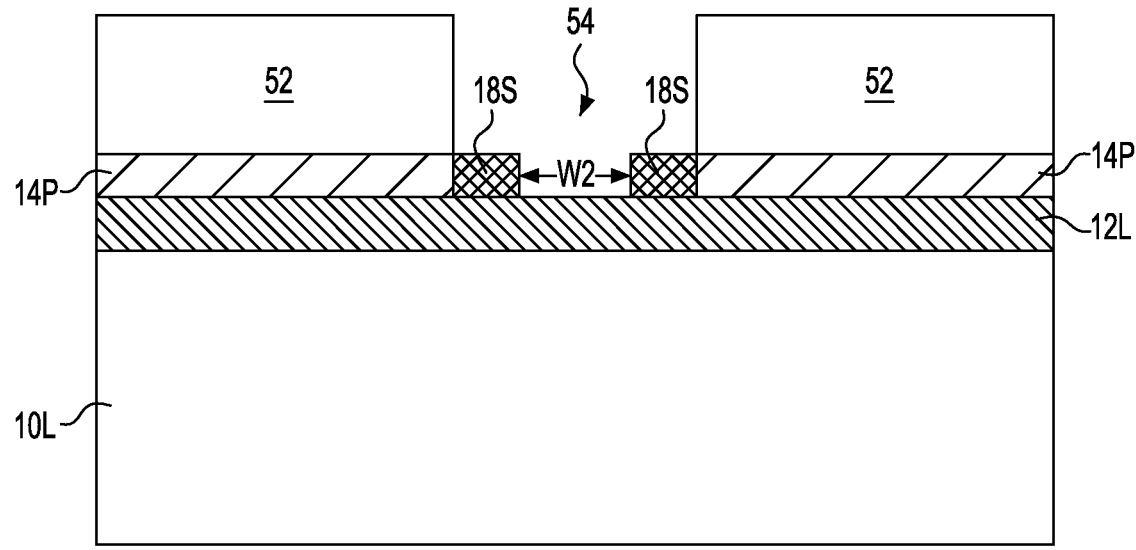
FIG. 14 is a cross sectional view of the exemplary semiconductor structure of FIG. 13 after reducing the first width of the line opening to provide a via opening having a second width by forming a metallic hard mask spacer portion on exposed sidewall surfaces of each metallic hard mask portion and within a portion of the line opening.

Referring now to FIG. 14, there is illustrated the exemplary semiconductor structure of FIG. 13 after reducing the first width, w1, of the line opening 50 to provide a via opening 54 having a second width, w2, by forming a metallic hard mask spacer portion 18S on exposed sidewall surfaces of each metallic hard mask portion 14P and within a portion of the line opening 50. As is shown, each metallic hard mask spacer portions 18S has a bottommost surface that is located on a portion of the topmost surface of the dielectric hard mask layer 12L.

In this embodiment of the present application, and due to the presence of the block mask 52, no metallic hard mask cap portion 18C is formed as was the case in the first embodiment of the present application. Thus, and in this embodiment, the metallic hard mask spacer portion 18S itself provides a metallic hard mask structure that is formed on the exposed sidewall surfaces of each metallic hard mask portion 14P. As is shown, and as mentioned in the previous embodiments of the present application, the metallic hard mask spacer portion 18S do not completely fill the opening, i.e., line opening 50.

The metallic hard mask spacer portion 18S that is formed in this embodiment of the present application includes one of the metallic hard mask materials mentioned above in forming the metallic hard mask structure with the proviso that the metallic hard mask spacer portion 18S comprises a metallic hard mask material that has a different etch rate as compared to the metallic hard mask material that was used in providing the metallic hard mask layer 14L. The metallic hard mask spacer portion 18S of this embodiment of the present application can be formed utilizing a selective deposition process as mentioned above in forming the metallic hard mask structure.

The metallic hard mask spacer portion 18S reduces the width of line opening 50 from the first width, w1, to a second width, w2; i.e., w2<w1. The reduced opening is now referred to as via opening 54. In one embodiment of the present application, the second width, w2, of the via opening 54 is from 5 nm to 30 nm. In another embodiment of the present application, w2 is from 10 nm to 20 nm. Other widths for w2 are possible as long as w2<w1. It is noted that the reduced width via opening 54 is formed without utilizing any exotic lithographic process such as, for example, EUV lithography.

Figure 15:
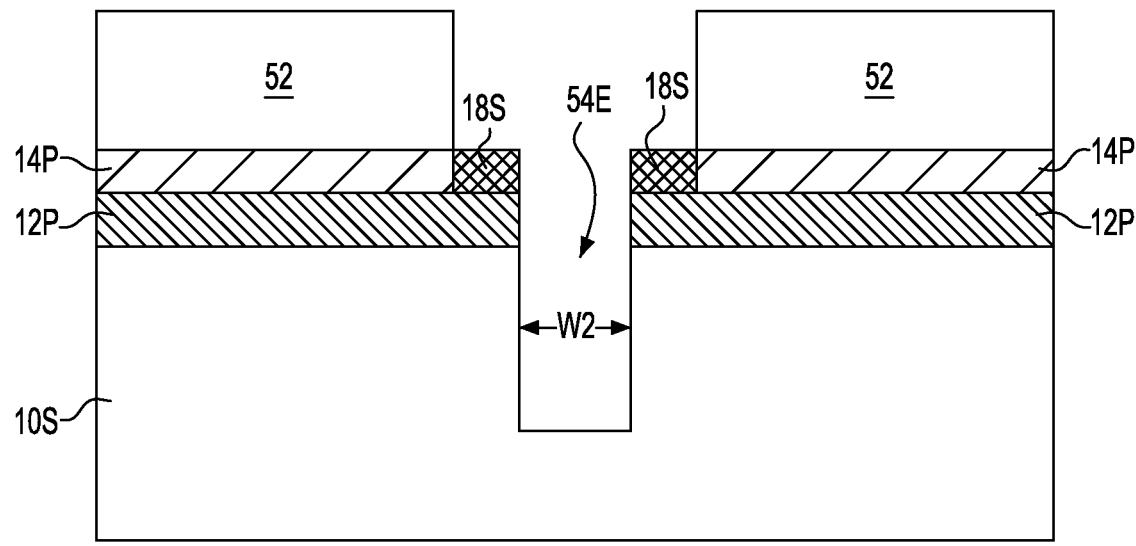
FIG. 15 is a cross sectional view of the exemplary semiconductor structure of FIG. 14 after extending the via opening having the second width through the dielectric hard mask layer and at least a portion of the interconnect dielectric material.

Referring now to FIG. 15, there is illustrated the exemplary semiconductor structure of FIG. 14 after extending the via opening 54 having the second width, w2, through the dielectric hard mask layer 12L and at least a portion of the interconnect dielectric material 10L. The extended via opening 54 is labeled as 54E in the drawings, and the interconnect dielectric material layer 10L that includes the extended via opening 54E is referred to as an interconnect dielectric material structure 10S.

In some embodiments of the present application, and as is illustrated, the extended via opening 54E has a bottommost surface that is located within a portion of the interconnect dielectric material structure 10S. In such an embodiment, the extended via opening 54E is formed partially, but not completely, through the interconnect dielectric material layer 10L such that the bottommost surface of the extended via opening contacts a dielectric surface of the interconnect dielectric material structure 10S. In other embodiments (not shown), the extended via opening 54E is formed entirely, i.e., completely, through the interconnect dielectric material layer 10L such that the bottommost surface of the extended via opening contacts a surface of an underlying substrate. The surface of the underlying substrate may be a topmost surface of the substrate or any sub-surface that is located beneath the topmost surface of the substrate.

The extending of the via opening 54 having the second width, w2, through the dielectric hard mask layer 12L and at least a portion of the interconnect dielectric material 10L comprises at least one etching process in which each metallic hard mask spacer portion 18S and the block mask 52 serve as an etch mask. The at least one etch that is used to extend the via opening 54 having the second width, w2, through the dielectric hard mask layer 12L and at least a portion of the interconnect dielectric material 10L comprises an anisotropic etching process. In one embodiment, at least one of the etching processes used in extending the via opening 54 having the second width, w2, through the dielectric hard mask layer 12L and at least a portion of the interconnect dielectric material 10L includes a reactive ion etching (RIE) process.

Figure 16:
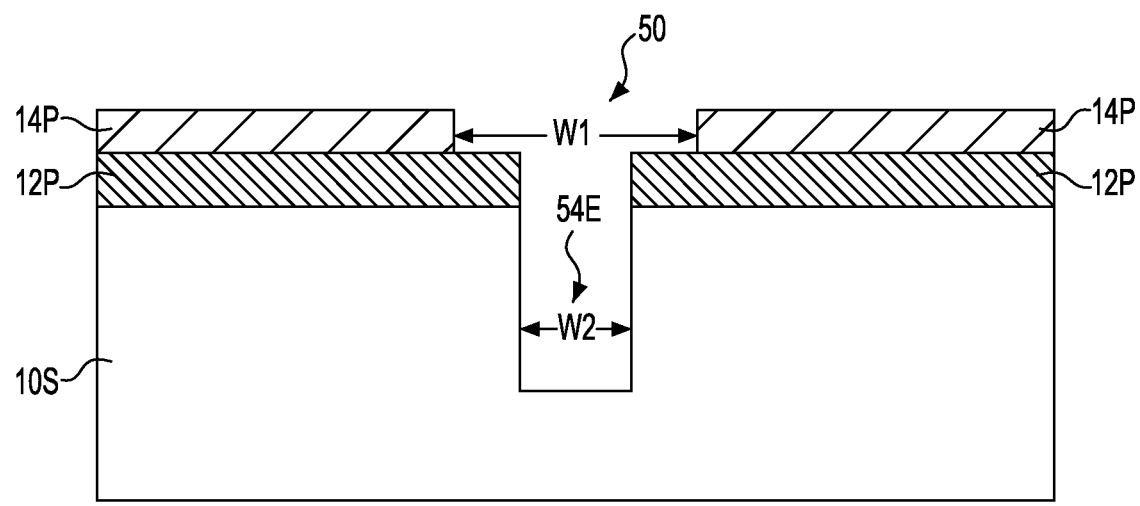
FIG. 16 is a cross sectional view of the exemplary semiconductor structure of FIG. 15 after removing the block mask and the metallic hard mask spacer portion from the structure.

Referring now to FIG. 16, there is illustrated the exemplary semiconductor structure of FIG. 15 after removing the block mask 52 and each metallic hard mask spacer portion 18S from the structure. After removing the metallic hard mask spacer portion 18S from the sidewall surface of each metallic hard mask portion 14P, line opening 50 having the first width is restored to the structure, namely, the space between each of the metallic hard mask portions is again equal to w1, i.e., the width of the line opening 50.

The block mask 52 can be removed utilizing any material removal process that selectively removes the block mask material from the structure relative to the underlying material layers (or portions). In one embodiment and when a photoresist is employed as the block mask material, a resist stripping process such as, for example, ashing may be used in removing the block mask 52 from the structure.

After removing the block mask 52 from the structure, the metallic hard mask spacer portion 18S is removed from the sidewall surface of each metallic hard mask portion 14P utilizing a selective etching process such as, for example, an anisotropic etching process. Because the metallic hard mask spacer portion 18S of this embodiment of the present application comprises a metallic hard mask material that has a different etch rate than the metallic hard mask material used in providing the metallic hard mask layer 14L, the metallic hard mask spacer portion 18S can be removed selective to the metallic hard mask layer 14L.

Figure 17:
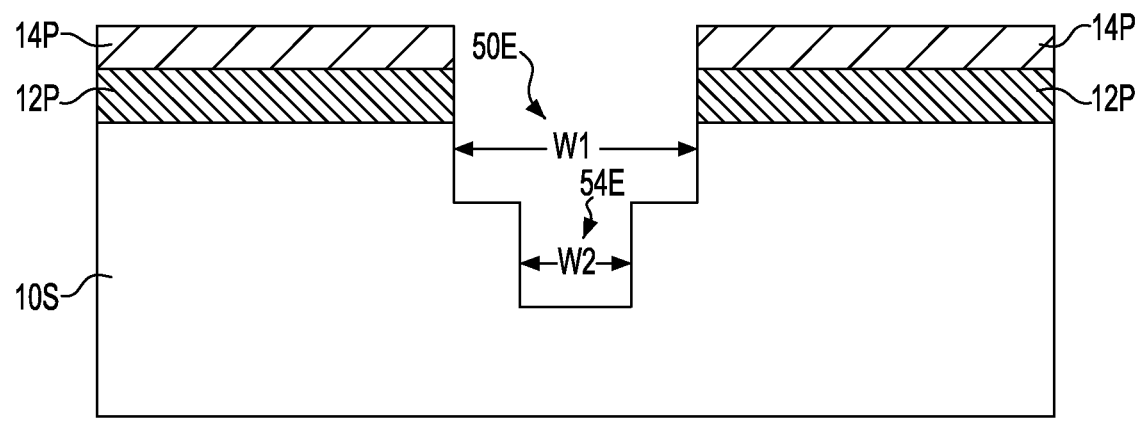
FIG. 17 is a cross sectional view of the exemplary semiconductor structure of FIG. 16 after extending the line opening having the first width through the dielectric hard mask layer and at least a portion of the interconnect dielectric material.

Referring now to FIG. 17, there is illustrated the exemplary semiconductor structure of FIG. 16 after extending the line opening 50 having the first width, w1, through the dielectric hard mask portions 12P and a portion of the interconnect dielectric structure 10S. The extended line opening 50 is labeled as 50E in the drawings.

In this embodiment of the present application, the extended via opening 50E is located in an upper portion of the interconnect dielectric structure 10S, while the extended via opening 54E is located within a bottom portion of the interconnect dielectric structure 10S. As is shown, the extended line opening 50E is located directly above and in communication with the extended via opening 54E.

The extending of the line opening 50 having the first width, w1, through the dielectric hard mask portions 12P and a portion of the interconnect dielectric material structure 10S comprises at least one etching process in which the remaining metallic hard mask portions 14P serve as an etch mask. The at least one etch that is used to extend the line opening 50 having the first width, w1, through the dielectric hard mask portions 12P and a portion of the interconnect dielectric material structure 10S comprises an anisotropic etching process. In one embodiment, a reactive ion etching (RIE) process is used to extend the line opening 50.

Figure 18:
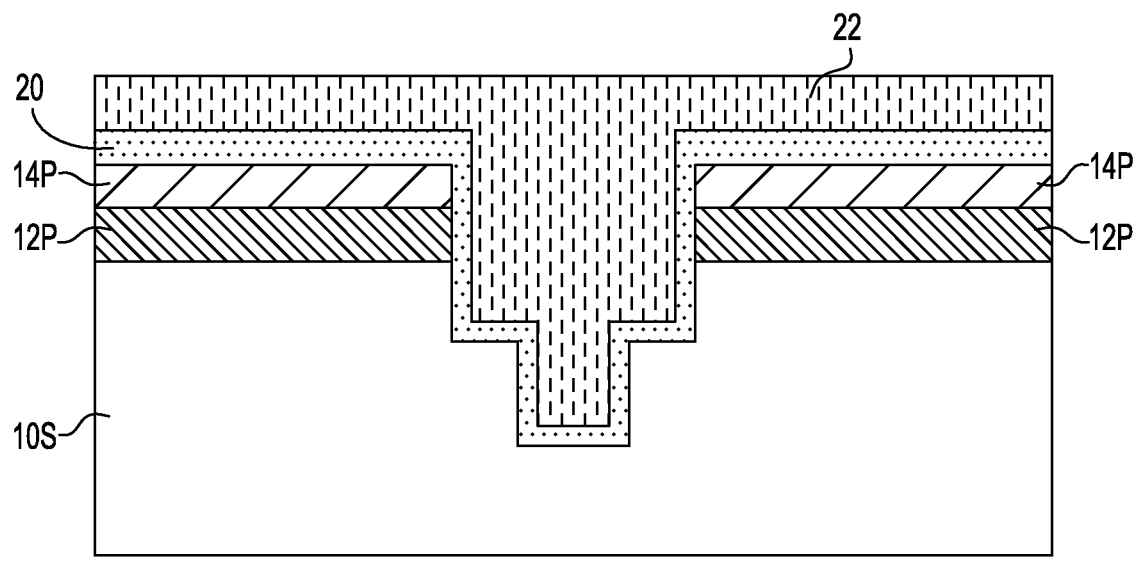
FIG. 18 is a cross sectional view of the exemplary semiconductor structure of FIG. 17 after providing a diffusion barrier layer and a conductive material.

Referring now to FIG. 18, there is illustrated the exemplary semiconductor structure of FIG. 17 after providing a diffusion barrier layer 20 and a conductive material 22. The diffusion barrier layer 20 and the conductive material 22 of this embodiment of the present application are the same mentioned above in the previous embodiments of the present application. Thus, the above description with respect to both the diffusion barrier layer 20 and the conductive material 22 is incorporated herein by reference.

Figure 19:
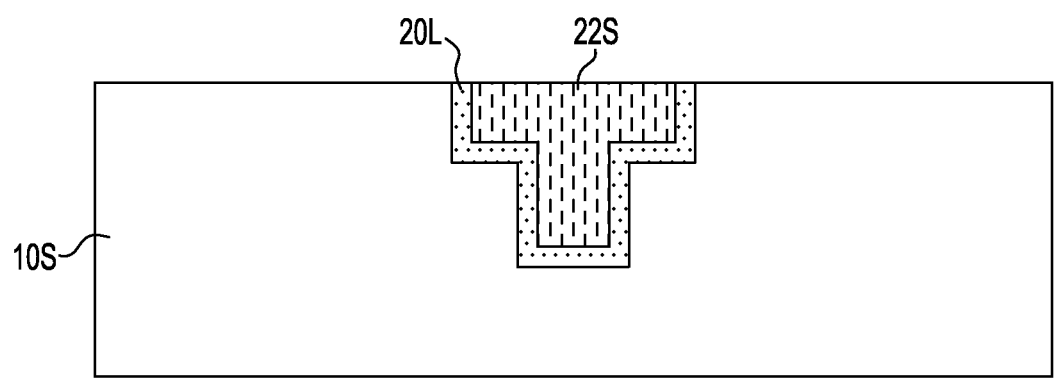
FIG. 19 is a cross sectional view of the exemplary semiconductor structure of FIG. 18 after performing a planarization process.

Referring now to FIG. 19, there is illustrated the exemplary semiconductor structure of FIG. 18 after performing a planarization process. The planarization process may include chemical mechanical planarization (often also referred to as chemical mechanical polishing) and/or grinding. The planarization process provides a planar interconnect structure as shown in FIG. 19. The planar interconnect structure includes interconnect dielectric material structure 10S, and remaining portions of the diffusion barrier layer 20 and remaining portions of the conductive material 22 within the extended via opening 54E and the extended line opening 50E that are present within the interconnect dielectric material structure 10S. The remaining portion of the diffusion barrier layer 20 is herein after referred to as a diffusion barrier liner 20L, while the remaining portion of the conductive material 22 is herein after referred to as a conductive material structure 22S. As is shown, the diffusion barrier liner 20L completely separates the conductive material structure 22S from the interconnect dielectric material structure 10S. Also, and as shown in FIG. 19, each of the diffusion barrier liner 20L and the conductive material structure 22S has a topmost surface that is coplanar with a topmost surface of the interconnect dielectric material structure 10S. The conductive material structure 22S has a bottom portion that has a shape and dimension of metallic line, and a top portion that has a shape and dimension of a metallic via.

The planarization process that is employed in the present application to provide the planar structure illustrated in FIG. 19 thus removes portions of the conductive material 22 and portions of the diffusion barrier layer 20 that are present atop each metallic hard mask cap portion 18C. Also, the planarization process removes the entirety of each metallic hard mask portion 14P, and the entirety of each dielectric hard mask portion 12P.

In some embodiments (not shown), a metallic cap and/or a dielectric cap can be formed. In other embodiments (also not shown), another interconnect dielectric material layer can be formed and processed as outline above.

In some embodiments of the present application (not illustrated), the planarization process may stop on the topmost surface of each dielectric hard mask portion 12P, and then a metallic cap and/or a dielectric cap may be formed to cover the exposed topmost surfaces of the diffusion barrier liner 20L and the conductive structure 22S.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming an interconnect structure comprising:
  providing a structure including, from bottom to top, an interconnect dielectric material layer, a dielectric hard mask layer, and a metallic hard mask layer;
  patterning said metallic hard mask layer to provide metallic hard mask portions on said dielectric hard mask layer, wherein adjacent metallic hard mask portions are spaced apart by a first opening having a first width;
  reducing said first width of said first opening to provide a second opening having a second width, wherein said reducing said first width of said first opening to provide said second opening having said second width comprises forming a metallic hard mask structure comprising at least a metallic hard mask spacer portion on a sidewall surface of each metallic hard mask portion; and
  extending said second opening having said second width entirely through said dielectric hard mask layer and at least partially through the interconnect dielectric material layer to provide an interconnect dielectric material structure having said second opening with said second width.

2. The method of claim 1, wherein said metallic hard mask structure further comprises forming a metallic hard mask cap portion on a topmost surface of each metallic hard mask portion and in direct contact with said metallic hard mask spacer portion, wherein said metallic hard mask cap portion and said metallic hard mask spacer portion comprise a same metallic hard mask material and are of unitary construction.

3. The method of claim 1, further comprising forming a diffusion barrier liner and a conductive structure in said second opening of said interconnect dielectric material structure.

4. The method of claim 3, wherein said forming said diffusion barrier liner and said conductive structure comprises:
  depositing a diffusion barrier layer lining at least said second opening of said interconnect dielectric material structure;
  depositing a conductive material on said diffusion barrier layer; and
  planarizing to a topmost surface of said interconnect dielectric material structure.

5. The method of claim 4, wherein said planarizing removes portions of said conductive material, portions of said diffusion barrier layer, said metallic hard mask portions and said dielectric hard mask layer from said topmost surface of said interconnect dielectric material structure.

6. The method of claim 1, wherein said second opening is a line opening, and said second width is from 5 nm to 30 nm.

7. A method of forming an interconnect structure comprising:
  providing a structure including, from bottom to top, an interconnect dielectric material layer, a dielectric hard mask layer, and a metallic hard mask layer;
  patterning said metallic hard mask layer to provide metallic hard mask portions on said dielectric hard mask layer, wherein adjacent metallic hard mask portions are spaced apart by a first opening having a first width;
  forming a block mask on a topmost surface of each metallic hard mask portion but not covering said first opening;
  reducing said first width of said first opening to provide a second opening having a second width, wherein said reducing said first width of said first opening to provide said second opening having said second width comprises forming a metallic hard mask structure comprising at least a metallic hard mask spacer portion on a sidewall surface of each metallic hard mask portion; and
  extending said second opening having said second width entirely through said dielectric hard mask layer and at least partially through the interconnect dielectric material layer to provide an interconnect dielectric material structure having said second opening with said second width.

8. The method of claim 7 further comprising removing said block mask and then forming a diffusion barrier liner and a conductive structure in said second opening of said interconnect dielectric material structure.

9. The method of claim 8, wherein said forming said diffusion barrier liner and said conductive structure comprises:
  depositing a diffusion barrier layer lining at least said second opening of said interconnect dielectric material structure;
  depositing a conductive material on said diffusion barrier layer; and
  planarizing to a topmost surface of said interconnect dielectric material structure.

10. The method of claim 8, wherein said planarizing removes portions of said conductive material, portions of said diffusion barrier layer, said metallic hard mask portions and said dielectric hard mask layer from said topmost surface of said interconnect dielectric material structure.

11. The method of claim 7, wherein said second opening is a via opening, and said second width is from 5 nm to 30 nm.

12. A method of forming an interconnect structure comprising:
  providing a structure including, from bottom to top, an interconnect dielectric material layer, a dielectric hard mask layer, and a metallic hard mask layer;
  patterning said metallic hard mask layer to provide metallic hard mask portions on said dielectric hard mask layer, wherein adjacent metallic hard mask portions are spaced apart by a line opening having a first width;

forming a block mask on a topmost surface of each metallic hard mask portion but not covering said line opening;

reducing said first width of said line opening to provide a via opening having a second width by forming a metallic hard mask spacer portion on a sidewall surface of each metallic hard mask portion;

extending said via opening having said second width entirely through said dielectric hard mask layer and at least partially through the interconnect dielectric material layer to provide an interconnect dielectric material structure having said via opening with said second width;

removing the metallic hard mask spacer portion from said sidewall surface of each metallic hard mask portion to restore said line opening having said first width between said adjacent metallic hard mask portions; and extending said line opening having said first width entirely through said dielectric hard mask layer and partially through the interconnect dielectric material structure, wherein said line opening having the first width is located in an upper portion of said interconnect dielectric material structure and said via opening of the second width is located in a lower portion of the interconnect dielectric material structure.

13. The method of claim 12, wherein said metallic hard mask spacer portion comprises a metallic hard mask material having a different etch rate than said metallic hard mask layer.

14. The method of claim 13, wherein said removing the metallic hard mask spacer portion from said sidewall surface of each metallic hard mask portion comprises a selective etching process.

15. The method of claim 12 further comprising removing said block mask and then forming a diffusion barrier liner and a conductive structure in said via opening and said line opening of said interconnect dielectric material structure.

16. The method of claim 15, wherein said forming said diffusion barrier liner and said conductive structure comprises:

depositing a diffusion barrier layer lining at said via opening and said line opening of said interconnect dielectric material structure;

depositing a conductive material on said diffusion barrier layer; and planarizing to a topmost surface of said interconnect dielectric material structure.

17. The method of claim 16, wherein said planarizing removes portions of said conductive material, portions of said diffusion barrier layer, said metallic hard mask portions and said dielectric hard mask layer from said topmost surface of said interconnect dielectric material structure.

* * * * *